US005851412A

United States Patent [19]

Kubby

[11] Patent Number: 5,851,412

[45] Date of Patent: Dec. 22, 1998

[54] THERMAL INK-JET PRINTHEAD WITH A SUSPENDED HEATING ELEMENT IN EACH EJECTOR

[75] Inventor: Joel A. Kubby, Rochester, N.Y.

[73] Assignee: Xerox Corporation, Stamford, Conn.

[21] Appl. No.: 929,599

[22] Filed: Sep. 15, 1997

Related U.S. Application Data

[62] Division of Ser. No. 609,198, Mar. 4, 1996, Pat. No. 5,706,041.

[51] Int. Cl.[6] .......... H01L 21/302

[52] U.S. Cl. .......... 216/27

[58] Field of Search .......... 216/2, 11, 27

[56] References Cited

U.S. PATENT DOCUMENTS

| | | | |
|---|---|---|---|
| 4,893,509 | 1/1990 | MacIver et al. | 216/2 |
| 4,894,664 | 1/1990 | Tsung Pan | 346/1.1 |
| 5,129,983 | 7/1992 | Greiff | 216/2 |
| 5,322,594 | 6/1994 | Bol | 216/27 |
| 5,458,254 | 10/1995 | Miyagawa et al. | 216/27 |
| 5,461,009 | 10/1995 | Huang et al. | 216/11 |
| 5,542,558 | 8/1996 | Benz et al. | 216/2 |
| 5,709,802 | 1/1998 | Furuhata et al. | 216/2 |

OTHER PUBLICATIONS

Marshall, J.C. et al "High–Level Melds Micromachined Devices with Foundries" IEEE Circuits and Devices, pp. 10–17, Nov. 1992.

Petersen, K.E. "Dynamic Micromechanics on Silicon: Techniques and Devices" IEEE Transactions on Electron Devices, vol.ED–25, Nol. 10, pp. 1241–1250, Oct. 1978.

Holland, L. et al "Bottom Contact Micromechanical Switching Geometry" IBM Technical Disclosure Bulletin, Vol. 21, No. 3, pp. 1207–1208, Aug. 1978.

*Primary Examiner*—R. Bruce Breneman
*Assistant Examiner*—Anita Alanko
*Attorney, Agent, or Firm*—R. Hutter

[57] ABSTRACT

In a thermal ink-jet printhead, a set of heating elements are formed in the main surface of a semiconductor chip. Channels are formed by etching within the semiconductor chip underneath each of the heating elements, thereby exposing two main sides of each heating element within each ejector. Because two main surfaces of the heating element are accessible to liquid ink in each ejector, efficiency and thermal characteristics of the printhead are improved.

11 Claims, 3 Drawing Sheets

FIG. 1
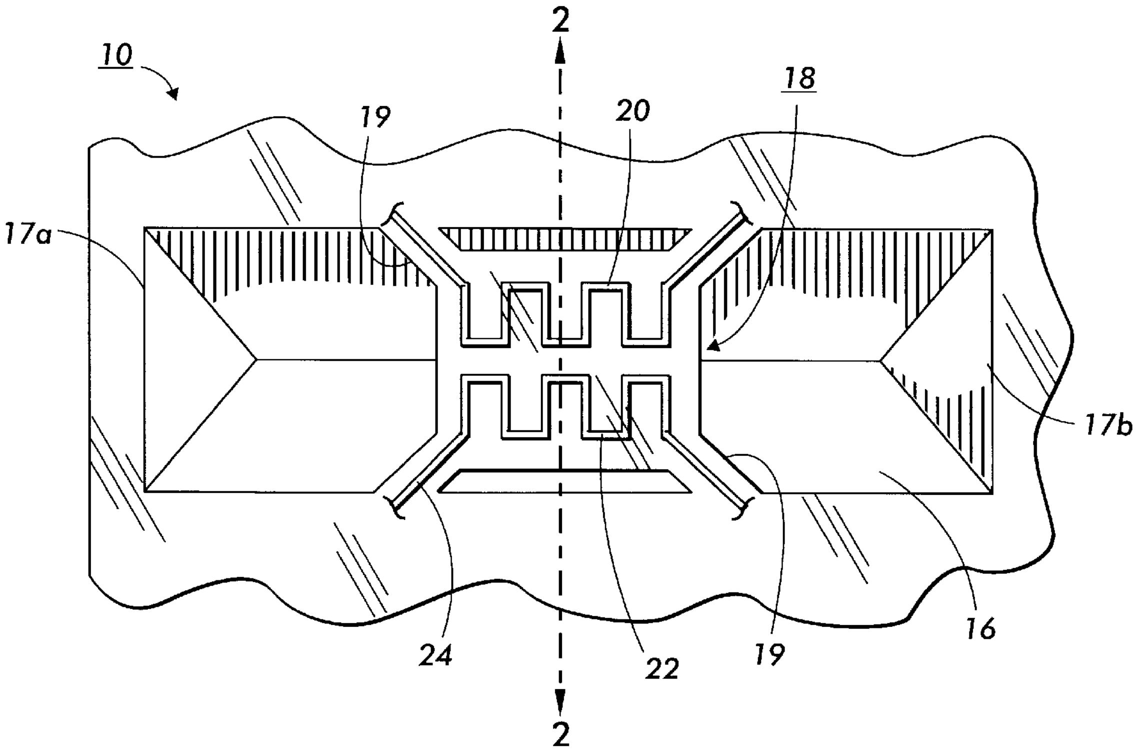
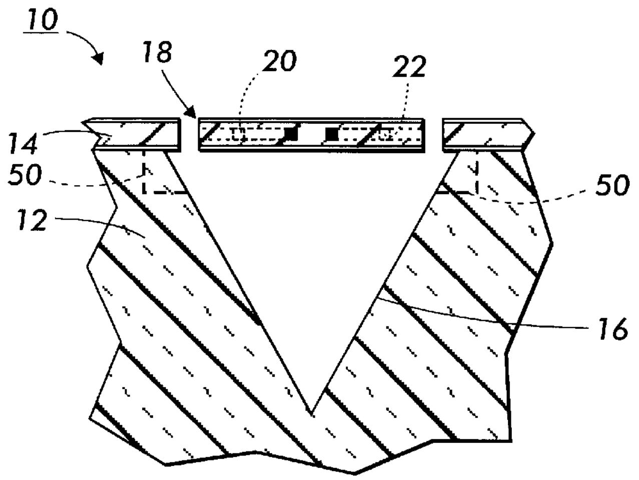
FIG. 2

FIG. 6
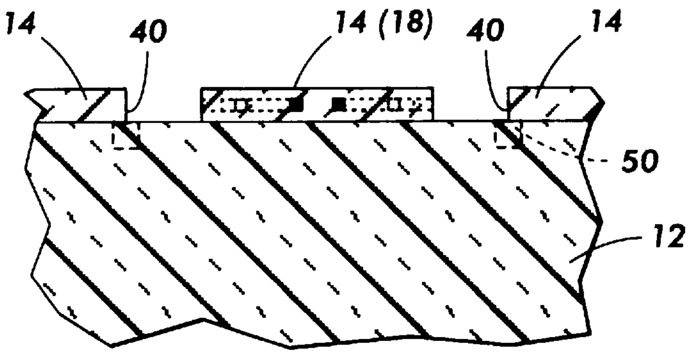
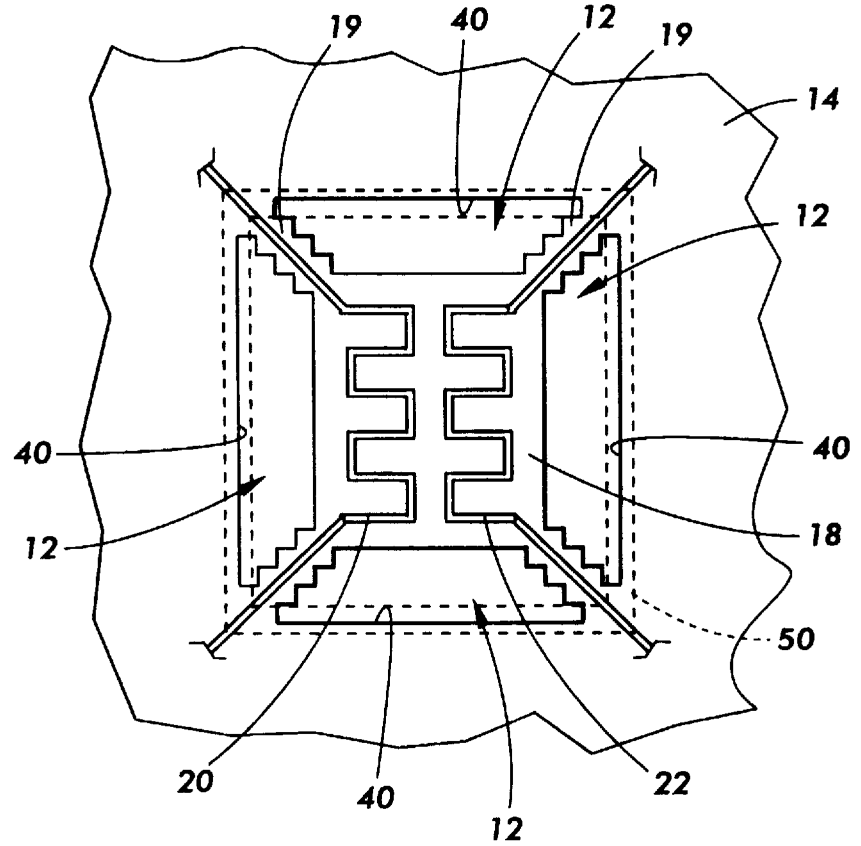
FIG. 7

THERMAL INK-JET PRINTHEAD WITH A SUSPENDED HEATING ELEMENT IN EACH EJECTOR

This application is a division of application Ser. No. 08/609,198, filed Mar. 4, 1996 now U.S. Pat. No. 5,706,041.

FIELD OF THE INVENTION

The present invention relates to a printhead for a thermal ink-jet printer, in which the heating element of each ejector is suspended to expose two sides thereof for vaporizing liquid ink.

BACKGROUND OF THE INVENTION

In thermal ink-jet printing, droplets of ink are selectably ejected from a plurality of drop ejectors in a printhead. The ejectors are operated in accordance with digital instructions to create a desired image on a print sheet moving past the printhead. The printhead may move back and forth relative to the sheet in a typewriter fashion, or the linear array may be of a size extending across the entire width of a sheet, to place the image on a sheet in a single pass.

The ejectors typically comprise capillary channels, or other ink passageways, which are connected to one or more common ink supply manifolds. Ink is retained within each channel until, in response to an appropriate digital signal, the ink in the channel is rapidly heated by a heating element (essentially a resistor) disposed on a surface within the channel. This rapid vaporization of the ink adjacent the channel creates a bubble which causes a quantity of liquid ink to be ejected through an opening associated with the channel to the print sheet. The process of rapid vaporization creating a bubble is generally known as "nucleation." One patent showing the general configuration of a typical ink-jet printhead is U.S. Pat. No. 4,774,530, assigned to the assignee in the present application.

In currently-common ink-jet printhead designs, such as the design shown in the above-referenced patent, the heating element is formed as a resistor in the surface of a silicon chip. While this arrangement of the heating element on a main surface of a chip is convenient from the standpoint of making the printhead, it has been found that disposing the heating element on a surface presents practical difficulties when the printhead is subject to demanding use, such as when printing at high speed or over long print runs. In brief, heat dissipated by the heating elements in a printhead is only partially functional to cause the ejection of liquid ink out of the printhead. Approximately half of all the heat generated by the heating elements in a printhead is not dissipated to the liquid ink directly, but rather is absorbed into the semiconductor chip, causing a general heating of the chip. This represents a simple waste of energy, which is particularly crucial in very large printheads, such as used in full-page-width designs; also, the constant heating of the printhead may seriously shorten the life span of the printhead.

Further, the gradual warming of the printhead over a long print run will undesirably pre-heat the liquid ink entering the printhead. As is well known, the precise size of ink droplets emitted from a printhead is closely related to the initial temperature of the liquid ink. If the liquid ink is consistently warmer than anticipated before it is ejected from the printhead, the resulting ink droplets will be larger than anticipated, creating larger ink spots on the print sheet, with a conspicuous negative effect on print quality. Various systems are known in the art for overcoming this problem of compensating for the initial temperature of liquid ink, but it would be preferable simply to have a system in which heat is less likely to accumulate over a long period of use of the printhead.

In order to overcome these problems associated with placing heating elements on a main surface of one or more heater chips, the present invention proposes "suspending" one or more heating elements within each ejector, whereby liquid ink to be nucleated and ejected is allowed to flow on two sides of the heating element, as opposed to the single side of the heating element in a conventional design. Suspending the heating element or elements in such a way provides several advantages. First, because two sides of the heating element are exposed to liquid ink, heat can be dissipated from the heating element to the liquid ink more efficiently. Second, because the heater is not in direct contact with the bulk of the heater chip, it is less likely that wasted heat will accumulate within the printhead itself, thereby undesirably pre-heating the liquid ink. Third, the fact that most of the heat dissipated by the heating element is passed to the liquid ink which is ejected, enables the ejection of liquid ink itself to act as a cooling system for the whole printhead; that is, every time a droplet is ejected from the printhead, the droplet carries away a quantity of excess heat with it.

The article by Marshall, Parameswaran, Zaghloul, and Gaitan, "High-Level CAD Melds Micromachined Devices with Foundries," *IEEE Circuits and Devices,* November 1992, p. 10, discloses techniques for making infrared point sources, such as for a thermal display, in which a resistor is suspended over a cavity which has been anisotropically etched in silicon.

SUMMARY OF THE INVENTION

According to one aspect of the present invention, there is provided a thermal ink-jet printhead comprising at least one ejector. The ejector includes a structure defining a capillary channel for passage of liquid ink therethrough. A suspended portion is disposed in the capillary channel, the suspended portion defining a first main surface and a second main surface opposite the first main surface. Both the first main surface and the second main surface are accessible to liquid ink in the capillary channel. The suspended portion includes a heating element.

According to another aspect of the present invention, there is provided a method of making a thermal ink-jet printhead, the printhead comprising at least one ejector which includes a heating element for vaporizing liquid ink adjacent thereto. A semiconductor chip is provided, including a functional layer disposed over a main surface of an etchable layer. The heating element is defined in a portion of the functional layer. A first opening is created in the functional layer adjacent the heating element, the first opening exposing a portion of the etchable layer. The etchable layer is then etched in an area encompassing the first opening and the heating element, thereby forming a cavity in the etchable layer under the heating element. A complementary structure is disposed over the main surface of the etchable layer, the complementary structure defining a channel therein. The portion of the functional layer including the heating element is thereby suspended between the cavity and the channel.

BRIEF DESCRIPTION OF THE DRAWINGS

In the drawings:

FIG. 1 is a plan view of a portion of an ejector according to the present invention, showing a heating element formed in the main surface of a semiconductor chip;

FIG. 2 is a sectional elevational view through line 2—2 of FIG. 1;

FIG. 6 is a sectional elevational view of a portion of a single ejector made according to the present invention, at a preliminary manufacturing step; and FIG. 7 is a plan view of a portion of a main surface of a chip, illustrating a preliminary step in the manufacture of a printhead according to the present invention.

DETAILED DESCRIPTION OF THE INVENTION

Figure 3:
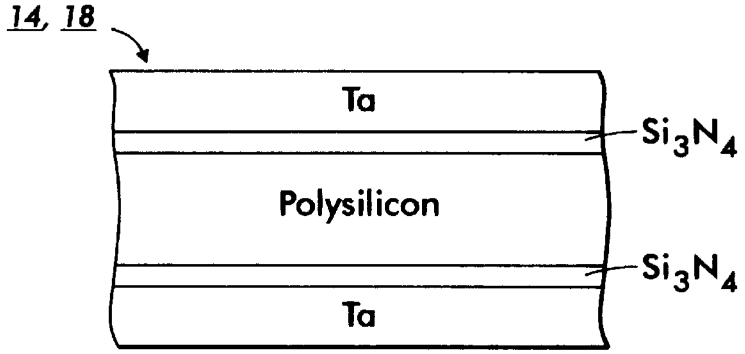
FIG. 3 is a sectional elevational view of a suspended portion of a heating element according to one embodiment of the present invention.

FIG. 1 is a plan view of a portion of a semiconductor chip which forms a portion of a thermal ink-jet printhead; FIG. 2 is a cross-sectional view through line 2—2 of FIG. 1. It will be understood that what is generally illustrated in FIGS. 1 and 2 is a portion of a "heater chip" showing portions of a single ejector as would appear in a thermal ink-jet printhead. FIG. 1 shows the main, or active, surface of a semiconductor chip used as a heater chip, where a selectably-actuable set of heating elements can be used to nucleate liquid ink adjacent thereto. Typically, a thermal ink-jet printhead includes a large number of such ejectors spaced typically between 300 and 600 ejectors per linear inch. As is also known in the art, the heater chip shown in FIGS. 1 and 2 is typically combined with another chip often known as a "channel plate" (not shown) which overlays the ejectors on the heater plate and forms complementary channels for the retention of liquid ink adjacent the ejector structures in the heater chip. The general principle of using a heater chip bound to a channel plate is disclosed in the patent referenced above, and is commonplace in the design of "side-shooter" ink-jet printheads.

With reference to FIGS. 1 and 2, a heater chip 10 is a semiconductor chip having a main substrate, such as shown as 12 in FIG. 2, of silicon. Disposed on the main surface of chip 10 over silicon substrate 12 is what is here generally referred to as a "functional layer" 14, the exact structure of which will vary depending on the particular purposes of the chip, as will be described in detail below. Generally, however, the functional layer 14 comprises various layers of silicon dioxide, polysilicon (in which semiconductor devices may be formed by doping) and protective layers such as made of tantalum or polyimide.

It can be clearly seen in FIGS. 1 and 2 that there is formed, in the substrate 12 of chip 10, a cavity 16. Cavity 16 accesses the main surface of the substrate 12 of chip 10 to at least two openings, such as indicated by a first opening 17*a* and a second opening 17*b*. Cavity 16 thus forms a channel extending from first opening 17*a* to second opening 17*b*. As is well known, silicon is readily "etchable" by chemical means, such as by applying KOH (potassium hydroxide liquid), $XeF_2$ (xenon difluoride gas), EDP (ethylenediamine-pyrocatechol), TMAH (tetramethyl ammonium hydroxide), or other solvents thereto, while the materials forming functional layer 14, such as oxide and/or aluminum, are not etchable relative to the silicon forming substrate 12. The crystalline structure of silicon is such that when chemical etchants are applied thereto, the relative etching rates along the different crystal axes are such that relatively neat polyhedral cavities are formed, such as the "roof" channel shown in FIG. 1, or alternately negative pyramidal cavities.

Also visible in FIGS. 1 and 2 is a "suspended" portion, shown as 18, co-planar with the main surface of the chip 10; it is evident that suspended portion 18 represents a portion of functional layer 14. Suspended portion 18 may be supported over cavity 16 by any number of "legs" 19 formed in functional layer 14. There is disposed within suspended portion 18 any number of specially doped regions, such as 20 or 22, which are preferably formed within at least one polysilicon layer within functional layer 14. As is known in the art, various semiconductor devices, such as resistors, can be obtained by doping specific areas in a polysilicon layer to particular resistivities. There is also shown, connecting to doped regions such as 20 and 22 any number of conductors, typically made of aluminum, such as 24, disposed over the legs 19. Depending on the functionality of the entire printhead, specific doped regions such as 20 and 22 within a polysilicon layer of functional layer 14 can be used as, for example, a resistor which, by virtue of its heat dissipation properties, can be used as a heating element for nucleating liquid ink in an ink-jet ejector, or alternately could be used as a thermistor, such as for measuring instantaneous liquid ink temperature within an ejector.

FIG. 3 is an example cross-sectional view through a suspended portion 18 (which is effectively part of functional layer 14) for an ink-jet ejector, shown in isolation. It can be seen that the central layer of the suspended portion 18 is a 0.4 $\mu$m polysilicon layer, specific regions of which may be doped as desired to obtain specific electrical properties, such as to create resistors. On either side of the polysilicon layer are insulative layers of $Si_3N_4$, typically of a layer of about 0.15 $\mu$m. Finally, on either side of the suspended portion 18 is a protective tantalum layer, typically 0.5 $\mu$m in thickness. It is known in the art that tantalum is useful protective substance to prevent corrosion of semiconductor structures by the liquid ink. It will be noted that, because both main surfaces of the suspended portion 18 shown in FIG. 3 are coated with tantalum, that this protective layer is present both in the direction facing away from and facing the rest of the chip 10, or rather both facing and facing away from substrate 12.

Figure 4:
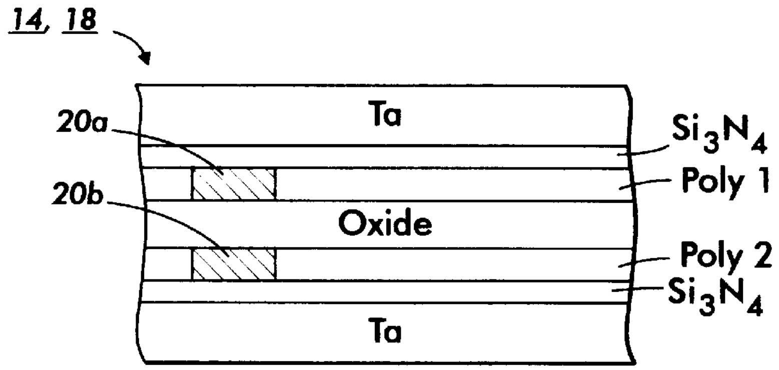
FIG. 4 is a sectional elevational view through a suspended portion of a heating element according to another embodiment of the present invention.

The particular embodiment of a suspended portion 18 shown in FIG. 3 includes only one polysilicon layer in which a semiconductor structure, such as a resistor forming a heating element, may be created. Although several individual semiconductor structures (such as 20, 22 in FIG. 1) may be created in this single layer of polysilicon, according to a more sophisticated embodiment of the present invention, multiple separate layers in which semiconductor devices may be created can be provided within a single suspended portion 18. FIG. 4 is a cross-sectional view showing in isolation a suspended portion 18 (again, ultimately part of functional layer 14) in which there are two separate active layers. Around a central layer of an oxide, there is disposed a first polysilicon layer (poly 1) and a second polysilicon layer (poly 2) on either main surface. These separate polysilicon layers are then overlaid with insulative layers such as of $Si_3N_4$, and finally with a protective layer such as of tantalum. As will be apparent to one skilled in the art, conductive traces such as of aluminum may be provided within this structure to access the circuit elements formed within the suspended portion 18.

As can be seen in FIG. 4, in certain regions of the poly 1 and poly 2 layers respectively there is disposed a particular doped region such as 20*a* or 20*b* (corresponding to region 20 in FIG. 1, for example). If these regions 20*a,* 20*b* are used as resistors, it will be apparent that these resistors can be used as heating elements for either side of the suspended region 18. That is, while in the view of FIG. 4 the resistor 20*a* will dissipate heat upward, the resistor of 20*b* will dissipate heat largely downward. Alternately, a resistor could be formed at 20*a* to function as a heating element, while 20*b* could function as a thermistor to monitor the behavior of heating element 20*a.*

Many practical advantages are enabled using a suspended portion 18 having two or more separate polysilicon layers in which semiconductor structures may be formed. For example, if one desired an ink-jet ejector capable of emitting droplets of two distinct sizes, actuation of both thermistors 20*a,* 20*b* could cause nucleation of a relatively large bubble (because nucleation is occurring on both sides of suspended portion 18), while actuation of only one heating element such as 20*a* or 20*b* would result in a smaller bubble being nucleated, and less liquid ink being expelled from the ejector. Alternately, in a two-heating element system, one heating element such as 20*b* could act as a backup in case the heating element of 20*a* failed; in this way, failure of one particular heating element in one particular ejector will not cause a complete failure of the printhead.

Figure 5:
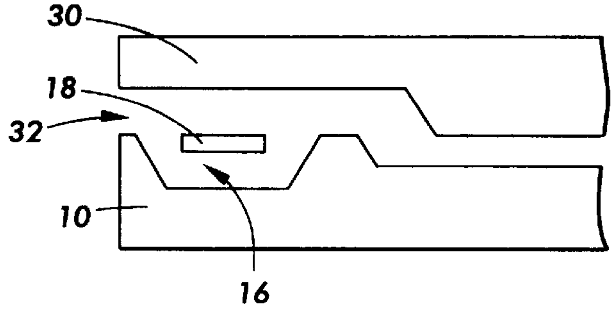
FIG. 5 is a sectional elevational view showing the basic layout of a complete ejector according to one embodiment of the present invention.

FIG. 5 is a cross-sectional view of a semiconductor chip 10 with a suspended portion 18, in combination with a complementary channel plate 30, forming therewith a cavity, or capillary channel, 32 in a single thermal ink-jet ejector. It will be noted that the suspended portion 18 is thereby exposed on both main sides thereof to liquid ink formed in the capillary channel between chip 10 and channel plate 30 for each ejector. The "suspension" of the heating elements within suspended portion 18 provides many practical advantages. Mainly, because heat can be dissipated from suspended portion 18 from both sides thereof, the overall heat-transference efficiency of the heating element as a whole is effectively almost doubled, compared to the more typical design in which a heating element is simply disposed on a main surface of the heater chip such as 10. Also, because two main surfaces of a heating element may be accessible to the liquid ink, the overall size of the ejector, including the area defined by the cavity 16 in the heater chip, may be made smaller than an equivalent heating element simply disposed on one surface of the heating element; this facilitates a more compact and fluidically efficient chip design while providing an equal amount of total surface area of the heating element.

FIG. 6 is a sectional elevational view of a single ejector, equivalent to that shown in FIG. 2, at a preliminary stage in the manufacturing of an ejector according to the present invention. In the view of FIG. 6, the structures for creating the suspended portion 18 from the functional layer 14 have been placed on the main substrate 12, but the cavity underneath the suspended portion has not yet been created. According to a preferred method of making an ink-jet ejector according to the present invention, the suspended portion 18 is formed by first exposing the bare silicon substrate 12 during wafer fabrication, followed by a post-processing anisotropic etch with an etchant such as those listed above. The silicon substrate 12 is exposed in an unconventional layout design by overlaying an active region, contact cut, and pad opening, one above the other; it should be noted that placing a pad opening above a contact cut is a serious layout design rule violation in typical fabrication techniques, but the design can nonetheless be implemented in conventional CMOS processing.

The bare silicon substrate 12 as shown in FIG. 6 is defined as an "open" tile and plane, according to a technique of creating micromechanical structures developed at the National Institute of Standards. FIG. 7 shows a plan view of a possible configuration of the bare exposed silicon 12, in the openings indicated as 40, formed in the functional layer 14. The configuration of the overall ejector in FIG. 7 is similar to that of FIG. 1, except that the FIG. 7 opening is closer to forming a complete square, as opposed to the elongated rectangle of FIG. 1. The openings such as 40 through which the bare silicon substrate 12 is exposed make those particular areas of the silicon substrate accessible to the etchant.

As is known in the art of crystalline materials, when an opening is made to expose an area of bare silicon, the resulting cavity takes the shape of an inverted pyramid, or pyramidal-shaped trench with a base being the smallest square or rectangle aligned with the crystal structure which encloses the vertices of the defined geometry. Thus, given a square geometry such as in FIG. 7, the resulting trench caused by the etchant removing silicon along the crystal structures thereof will be a square-based pyramid corresponding to the general square perimeters of the openings 40, assuming that the crystal vertices of the silicon 12 are aligned with the outer edges formed by openings 40. If the open exposed silicon is rectangular in shape, and aligned with the axes of the crystal, then the resulting cavity is an inverted pyramidal-shaped trench with the open rectangle as its base, such as in the example of FIG. 1. If the opening is defined with a geometry other than a square or rectangle and/or with a misalignment with respect to the axes of the crystal, then the resulting cavity is an inverted pyramid or pyramidal-shaped trench which has a square or rectangular base which is aligned with respect to the axes and is the smallest square or rectangle that can enclose the vertices of the defined geometry.

As can further be seen in FIG. 7, the openings 40 can be configured to create the relatively thin "legs" 19 connecting the suspended portion 18 to the rest of the functional layer 14. These legs 19 can be as thin as mechanical stability will allow. Generally, presence of these legs does not affect the final shape of the etched cavity in the final printhead.

In order to control the behavior of an etchant forming the cavity 16 in a substrate 12, there may be provided within substrate 12 before the formation of functional layer 14 thereon, a p+ diffusion created by ion implantation in selected areas of the substrate to form an "etch stop" which will prevent further activity of the etchant beyond the areas circumscribed by the etch stop, indicated as 50 in both FIGS. 6 and 7, and which can also be seen in FIG. 2. Returning for a moment to FIG. 2, there also may be provided a slight "overhang" of the functional layer 14, or in other words a slight undercut of the cavity 16, as shown. It may also be desirable, for certain printhead designs, to halt the activities of the etchant before the entire pyramid or pyramidal-shaped trench is formed, thereby leaving a flat bottom to the cavity 16 as opposed to the sharply-defined trench shown for example in FIG. 2.

While the invention has been described with reference to the structure disclosed, it is not confined to the details set forth, but is intended to cover such modifications or changes as may come within the scope of the following claims.

I claim:

1. A method of making a thermal inkjet printhead, the printhead comprising at least one ejector, the ejector including a heating element for vaporizing liquid ink adjacent thereto, comprising the steps of:

providing a semiconductor chip including a functional layer disposed over a main surface of an etchable layer, the heating element being defined in a portion of the functional layer;

creating a first opening in the functional layer adjacent the heating element, the first opening exposing a portion of the etchable layer;

etching an area of the etchable layer, the area encompassing the first opening and the heating element, thereby forming a cavity in the etchable layer under the heating element; and providing a complementary structure over the main surface of the etchable layer, the complementary structure defining a channel therein, whereby the portion of the functional layer including the heating element is suspended between the cavity and the channel.

2. The method of claim 1, further comprising the step of creating a second opening in the functional layer adjacent the heating element, the second opening exposing a portion of the etchable layer; and wherein the etching step includes etching an area of the etchable layer encompassing the second opening, whereby the cavity forms a channel between the first opening and the second opening.

3. The method of claim 1, the functional layer including a polysilicon layer, the heating element being defined as an area doped to a predetermined resistivity within the polysilicon layer.

4. The method of claim 1, the functional layer further including a second polysilicon layer, a second heating element defined as an area doped to a predetermined resistivity within the second polysilicon layer, and an insulating layer disposed between the first-mentioned polysilicon layer and the second polysilicon layer.

5. The method of claim 1, the functional layer comprising a first protective layer on a first main surface thereof opposite the etchable layer and a second protective layer on a second main surface thereof facing the etchable layer.

6. A method of making an ejector for a thermal ink-jet printhead, comprising the steps of:

providing a semiconductor chip including a functional layer disposed over a main surface of an etchable layer, wherein a heating element is defined in a portion of the functional layer;

providing a first opening in the functional layer, the first opening exposing a portion of the etchable layer; and etching an area of the etchable layer, thereby forming a channel in the etchable layer extending from the first opening under a portion of the functional layer, the channel extending under the heating element, thereby forming an ink passageway for the ejector.

7. The method of claim 6, further comprising the step of providing a second opening in the functional layer, the second opening exposing a portion of the etchable layer, and wherein the etching step includes etching an area of the etchable layer encompassed by the first opening and the second opening, thereby forming a channel in the etchable layer extending from the first opening to the second opening.

8. The method of claim 7, wherein a heating element is defined in the functional layer between the first opening and the second opening.

9. The method of claim 6, the etchable layer comprising crystalline silicon.

10. The method of claim 9, the etching step comprising applying a solvent to the crystalline silicon encompassed by the first opening.

11. The method of claim 6, the functional layer including a polysilicon layer.

* * * * *